(12) United States Patent
Kirihara et al.

(10) Patent No.: US 7,585,751 B2
(45) Date of Patent: Sep. 8, 2009

(54) WAFER DIVIDING METHOD USING LASER BEAM WITH AN ANNULAR SPOT

(75) Inventors: Naotoshi Kirihara, Ota-Ku (JP); Koji Yamaguchi, Ota-ku (JP); Yukio Morishige, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/140,914

(22) Filed: Jun. 17, 2008

(65) Prior Publication Data
US 2009/0017600 A1   Jan. 15, 2009

(30) Foreign Application Priority Data
Jul. 13, 2007   (JP)   ............... 2007-184160

(51) Int. Cl.
*H01L 21/304*   (2006.01)
(52) U.S. Cl. ............... 438/462; 438/463; 257/E21.238
(58) Field of Classification Search ............... 438/462, 438/463; 257/E21.238
See application file for complete search history.

(56) References Cited

U.S. PATENT DOCUMENTS

| | | | | |
|---|---|---|---|---|
| 6,420,245 | B1 * | 7/2002 | Manor | 438/460 |
| 6,555,447 | B2 * | 4/2003 | Weishauss et al. | 438/460 |
| 6,562,698 | B2 * | 5/2003 | Manor | 438/460 |
| 6,812,717 | B2 * | 11/2004 | Borden et al. | 324/752 |
| 7,087,857 | B2 * | 8/2006 | Nakamura et al. | 219/121.72 |
| 2002/0031899 | A1 * | 3/2002 | Manor | 438/460 |
| 2003/0060024 | A1 * | 3/2003 | Imori | 438/460 |
| 2003/0155693 | A1 * | 8/2003 | Farnworth et al. | 264/401 |
| 2004/0188400 | A1 * | 9/2004 | Peng et al. | 219/121.72 |
| 2005/0101108 | A1 * | 5/2005 | Genda et al. | 438/462 |
| 2006/0009008 | A1 * | 1/2006 | Kaneuchi et al. | 438/463 |
| 2006/0079024 | A1 * | 4/2006 | Akram | 438/110 |

FOREIGN PATENT DOCUMENTS

JP   A 2005-64231   3/2005

* cited by examiner

*Primary Examiner*—Evan Pert
(74) *Attorney, Agent, or Firm*—Greer, Burns & Crain, Ltd.

(57) ABSTRACT

In a wafer dividing method of dividing a wafer into individual devices, the wafer being sectioned by streets to form the devices each made of a laminated body in which an insulating film and a function film are laminated on a front surface of a semiconductor substrate, the method includes a laser processing groove forming step for forming a laser processing groove on the laminated body so as to reach the semiconductor substrate by applying a laser beam formed with an annular spot to the laminated body side of the wafer along the street, the annular spot having an outer diameter larger than a width of a cutting blade and smaller than a width of the street; and a cutting step for allowing a cutting blade to cut the semiconductor substrate of the semiconductor wafer along the laser processing groove formed at the street.

1 Claim, 9 Drawing Sheets

WAFER DIVIDING METHOD USING LASER BEAM WITH AN ANNULAR SPOT

BACKGROUND OF THE INVENTION

1. Field of the Invention

The present invention relates to a wafer dividing method of dividing a wafer into individual devices by a cutting blade cutting the wafer along streets, the wafer being formed with the devices sectioned by the streets, the devices being each formed of a laminated body in which an insulation film and a function film are laminated on the front surface of a semiconductor substrate.

2. Description of the Related Art

As well-known by those skilled in the art, a semiconductor device fabrication step forms a semiconductor wafer in which devices such as ICs, LSIs or the like formed in a matrix pattern by laminated bodies each formed of an insulating film and a function film laminated on the front surface of a semiconductor substrate such as silicon or the like. The semiconductor thus formed is sectioned by predetermined cutting lines called streets. Individual devices are manufactured by dividing the semiconductor wafer along the streets.

Such division of the wafer along the streets is generally executed by a cutting device. This cutting device includes a chuck table adapted to hold a semiconductor wafer, i.e., a workpiece; cutting means for cutting the semiconductor wafer held by the chuck table; and moving means for relatively moving the chuck table and the cutting means. The cutting means includes a rotary spindle rotated at high-speeds and a cutting blade attached to the spindle. The cutting blade is composed of a disklike base and an annular cutting edge attached to the lateral outer-circumferential portion of the base. The cutting edge is fixedly formed, by electrocasting, with e.g. diamond abrasive grains each having a diameter of about 3 µm.

In recent years, semiconductor wafers in the following form have been put to practical use in order to improve a throughput capacity for devices such as ICs, LSIs or the like. That is to say, the devices are each formed of a laminated body in which a low-dielectric insulation film (Low-k film) and a function film formed with a circuit are laminated on the front surface of a semiconductor substrate such as silicon or the like. The low-dielectric film is made of an inorganic film such as SiOF, BSG (SiOB) or the like or of an organic film which is a polymer film such as a polyimide-series, a parylene series or the like. Since the Low-k film mentioned above is different from the material of the wafer, it is difficult to cut both the Low-k film and the wafer at the same time by a cutting blade. More specifically, the Low-k film is very fragile like mica. Therefore, if the semiconductor wafer is cut along streets by the cutting blade, the Low-k film is exfoliated. The exfoliation reaches the circuit to pose a problem of fatally damaging the device.

To solve the problem mentioned above, a wafer dividing method is disclosed by Japanese Patent Laid-Open No. 2005-64231. In this method, a laminated body is sectioned by forming laser-processing grooves along respective streets formed on a semiconductor wafer. A cutting blade is positioned at each of the laser-processing grooves and the cutting blade and the semiconductor wafer are relatively moved. In this way, the semiconductor wafer is cut along the streets.

An energy distribution of a laser beam focused by a concentrator equipped with a generally used condenser lens exhibits a Gaussian distribution in which energy is strong at a central portion and is progressively weaker as it goes outward. Like this, the laser processing groove processed by the laser beam forming the Gaussian distribution causes unprocessed portions at lateral wall lower portions. It is necessary to form a laser processing groove having a width appropriately broader than the thickness of the cutting blade taking into account the unprocessed portions. This has to increase the interval between streets formed on the wafer. Thus, the streets account for a large portion of the wafer, posing a problem of poor productivity.

SUMMARY OF THE INVENTION

Accordingly, it is an object of the present invention to provide a wafer dividing method that can divide a wafer into a plurality of individual devices without increasing an interval between streets, the wafer being formed with the devices each formed of a laminated body in which an insulting film and a function film are laminated on a front surface of a semiconductor substrate such as silicon or the like.

In accordance with an aspect of the present invention, there is provided a wafer dividing method of dividing a wafer into individual devices, the wafer being sectioned by streets to form the devices each made of a laminated body in which an insulating film and a function film are laminated on a front surface of a semiconductor substrate, the method including: a laser processing groove forming step for forming a laser processing groove on the laminated body so as to reach the semiconductor substrate by applying a laser beam formed with an annular spot to the laminated body side of the wafer along the streets, the annular spot having an outer diameter larger than a width of a cutting blade and smaller than a width of the street; and a cutting step for allowing a cutting blade to cut the semiconductor substrate of the semiconductor wafer along the laser processing groove formed at the street.

In the wafer dividing method according to the present invention, the laser processing groove forming step is such that a laser processing groove is formed on the laminated body so as to reach the semiconductor substrate by applying a laser beam formed with an annular spot to the laminated body of the wafer along the street, the annular spot having an outer diameter larger than a width of a cutting blade and smaller than a width of the street. The lateral walls of the laser processing groove are formed vertically to the processing surface (the upper surface) of the laminated body, which does not cause unprocessed portions at the respective lateral wall lower portions. Thus, it is not necessary to increase the width between the lateral walls of the laser processing groove otherwise taking into account the unprocessed portions. Consequently, it is possible to reduce the width of the street formed in the wafer as much as possible.

The above and other object, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
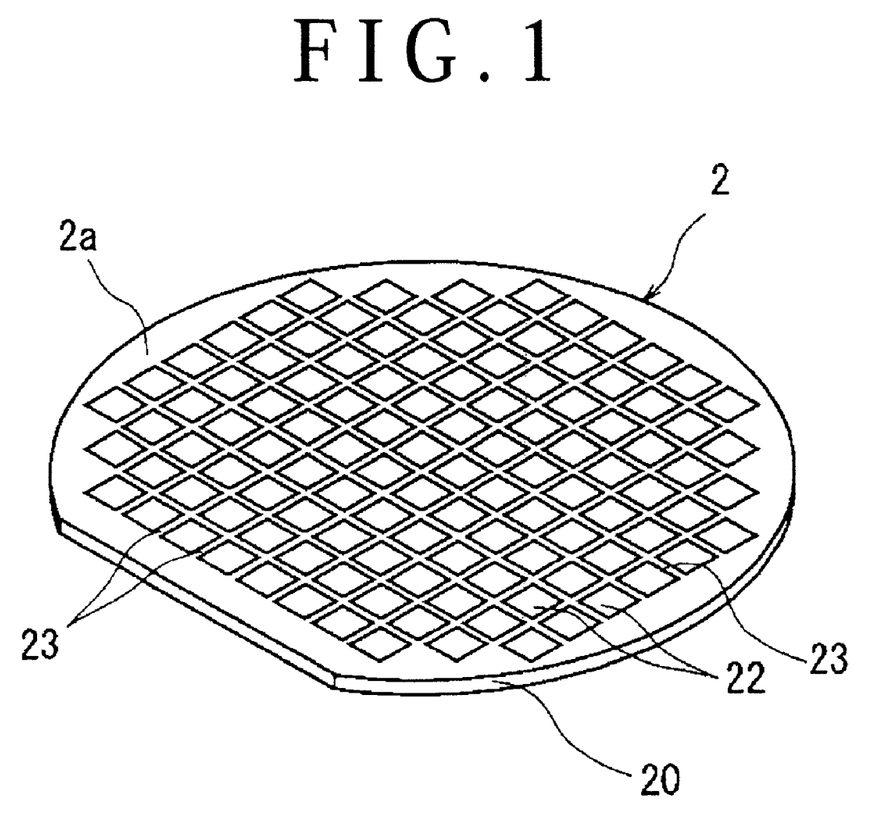
FIG. 1 is a perspective view illustrating a semiconductor wafer to be divided by a wafer dividing method according to the present invention.
Figure 2:
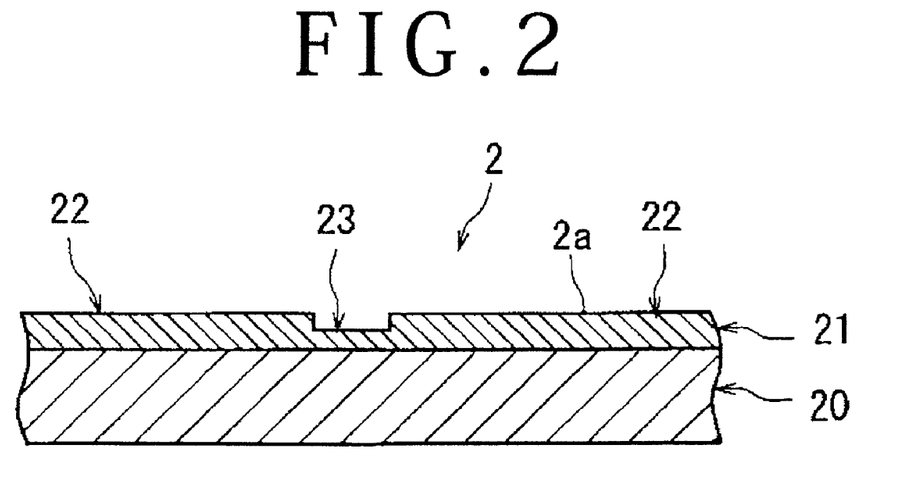
FIG. 2 is an enlarged cross-sectional view of the semiconductor wafer shown in FIG. 1.

A wafer laser-dividing method according to the present invention will hereinafter be described in further detail with reference to the accompanying drawings. FIG. 1 is a perspective view of a semiconductor wafer as a wafer processed by the wafer laser-dividing method of the present invention. FIG. 2 is an enlarged cross-sectional view of an essential portion of the semiconductor wafer shown in FIG. 1. A semiconductor wafer 2 shown in FIGS. 1 and 2 is such that a plurality of devices 22 such as ICs, LSIs or the like are formed in a matrix pattern on the front side of a semiconductor substrate 20 made of silicon or the like. The devices 22 are each formed of a laminated body 21 in which an insulating film and a function film formed with a circuit are laminated one on another. In addition, the devices 2 are sectioned by streets 23 formed in a lattice pattern. Incidentally, in the illustrated embodiment, the insulating film forming part of the laminated body 21 is made of a low-dielectric insulation film (Low-k film) made of an inorganic film such as an $SiO_2$ film, SiOF, BSG (SiOB) or the like or of an organic film which is a polymer film such as a polyimide system, parylene system or the like.

Figure 3:
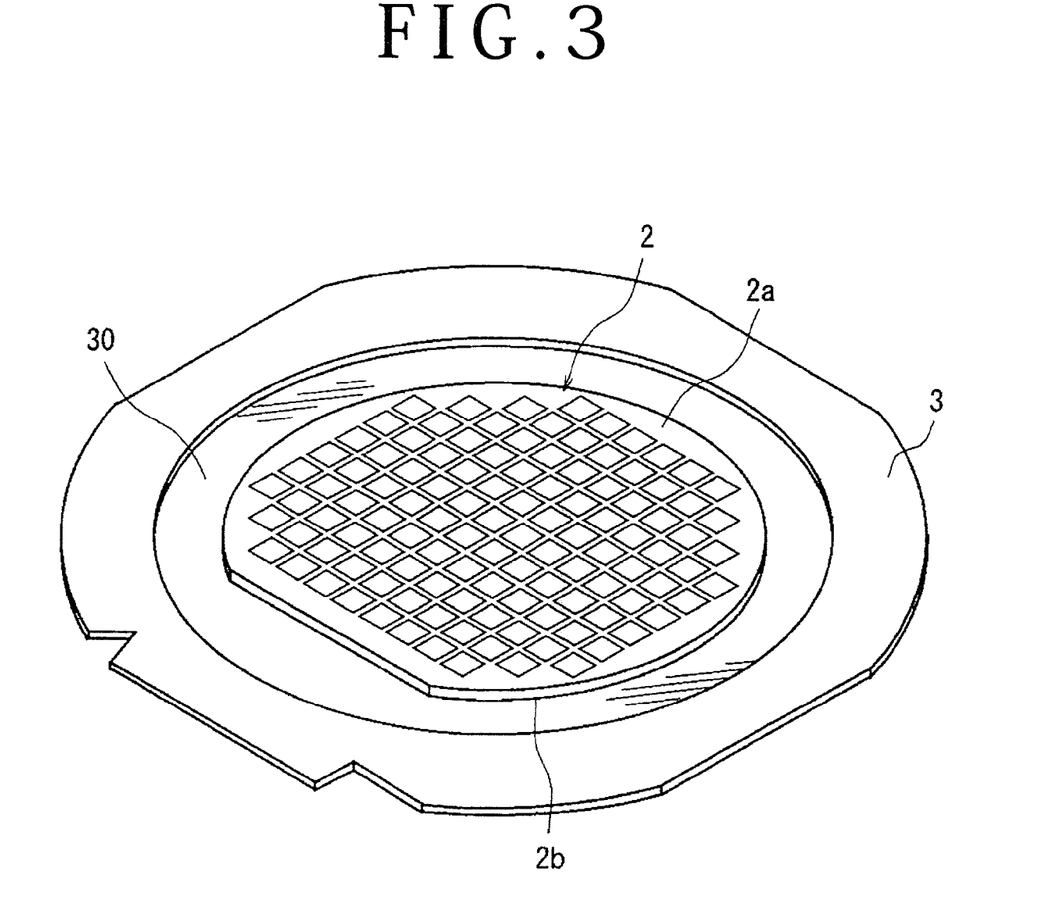
FIG. 3 is a perspective view illustrating a state where the semiconductor wafer shown in FIG. 1 is carried by an annular frame via a dicing tape.

To divide the semiconductor wafer 2 described above along the streets 23, as shown in FIG. 3, the semiconductor wafer 2 is stuck to a dicing tape 30 attached to an annular frame 3. In this case, the rear side 2b of the semiconductor wafer 2 is stuck to the dicing tape 30 with the front side 2a facing the upside.

A laser processing groove forming step is next performed. In this step, a laser beam is applied to the laminated body 21 of the semiconductor wafer 2 along the each of the streets 23 to form a laser processing groove in the laminated body 21 so as to reach the semiconductor substrate 20. The laser beam is formed with an annular spot having an outer diameter larger than the width of a cutting blade described later. This laser processing groove forming step is performed using a laser processing machine 4 shown in FIGS. 4 and 5. The laser processing machine 4 includes a chuck table 41 adapted to hold a workpiece and laser beam irradiation means 42 for applying a laser beam to the work piece held on the chuck table 41. The chuck table 41 is configured to suck and hold the workpiece and to be moved by a moving mechanism not shown in a process-transfer direction indicated with arrow X in FIG. 4 and in an indexing-transfer direction indicated with arrow Y.

Figure 5:
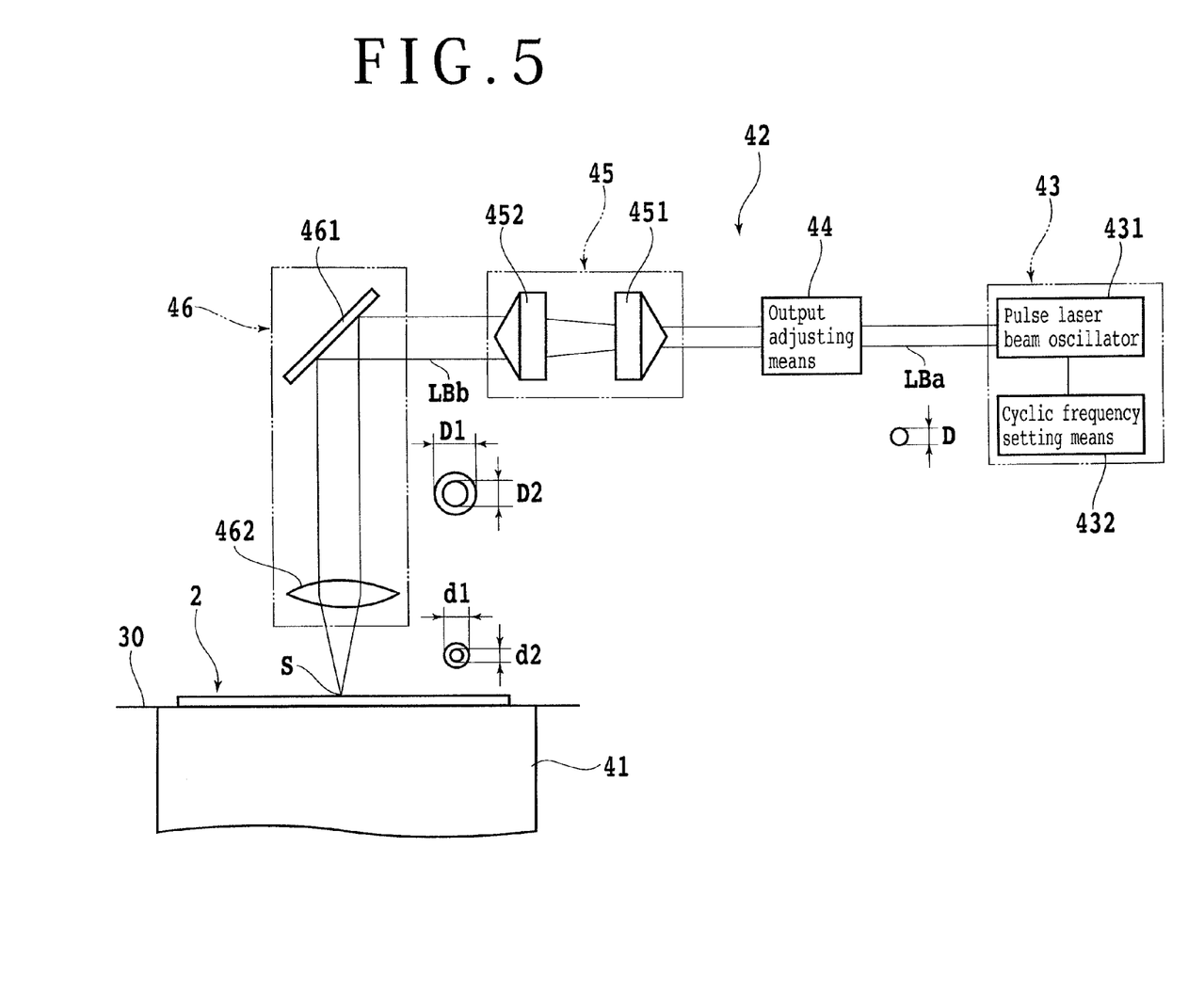
FIG. 5 is a schematic block diagram illustrating a configuration of laser beam irradiation means equipped in the laser processing device shown in FIG. 4.

The laser beam irradiation means 42 includes a substantially horizontally arranged cylindrical casing 421. This casing 421 internally includes pulse laser beam oscillating means 43, output adjusting means 44 and annular spot forming means 45 as shown in FIG. 5. The pulse laser beam oscillating means 43 includes a pulse laser beam oscillator 431 including a YAG laser oscillator or YVO4 laser oscillator and cyclic frequency setting means 432 attached to the pulse laser beam oscillator 431. The pulse laser beam oscillating means 43 constructed as above emits a pulse laser beam LBa shaped in a circle in cross-section to have e.g. a diameter (D) of 2 mm. The output adjusting means 44 adjusts the pulse laser beam emitted from the pulse laser beam oscillating means 43 to a desired output. The pulse laser beam oscillating means 43 and the output adjusting means 44 are controlled by control means not shown.

In the illustrated embodiment, the annular spot forming means 45 is composed of a pair of first conic lens 451 and second conic lens 452. The annular spot forming means 45 brings the pulse laser beam LBa that was emitted from the pulse laser beam oscillation means 43 and adjusted to the desired output by the output adjusting means 44 to have a circle in cross-section, into a pulse laser beam LBb formed annular in cross-section. More specifically, the annular spot forming means 45 brings the pulse laser beam LBa having a diameter of 2 mm into the annular pulse laser beam LBb expanded to have e.g. an outer diameter (D1) of 10 mm and an inner diameter (D2) of 8 mm and formed as parallel beams.

A condenser 46 is attached to the leading end of the casing 421. The condenser 46 includes a direction-changing mirror 461 and an objective condensing lens 462. The direction-changing mirror 461 is adapted to change the direction of the pulse laser beam LBb formed in annularity in cross-section by the annular spot forming means 45 toward the objective condensing lens 462. The objective condensing lens 462 condenses the pulse laser beam LBb whose direction is changed by the direction-changing mirror 461 and applies it to the workpiece held by the chuck table 41, at a spot S. As exaggeratedly illustrated, this spot S is formed in cross-section as an annularity having an outer diameter of (d1) and an inner diameter of (d2).

Figure 6:
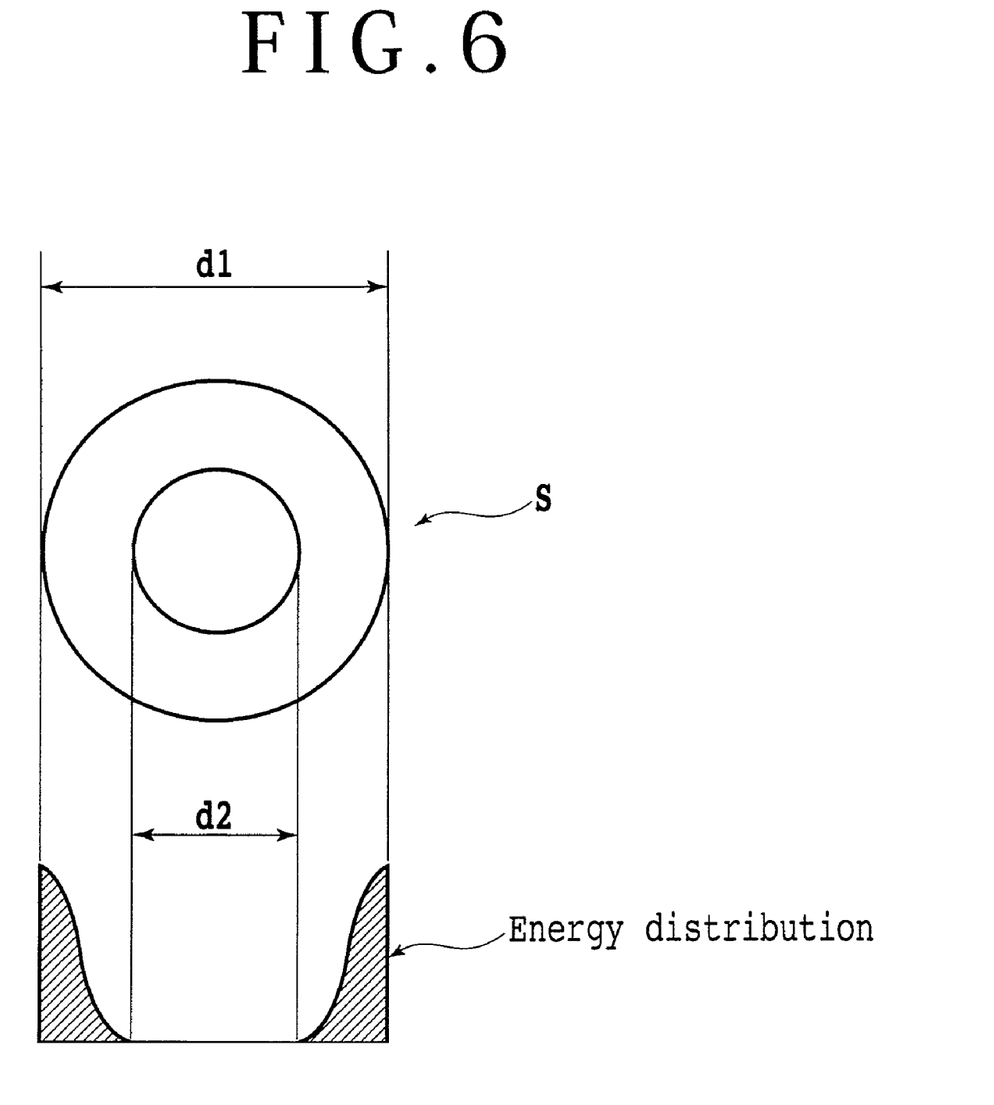
FIG. 6 is an explanatory diagram illustrating an energy distribution of a laser beam applied by the laser beam irradiation means shown in FIG. 5, the laser beam having a spot formed in annularity in cross-section.

A description is given of an energy distribution of the pulse laser beam LBb formed to have the annular spot S, in cross-section, with the outer diameter (d1) and the inner diameter (d2) with reference to FIG. 6. As shown in FIG. 6, the energy distribution of the pulse laser beam LBb formed to have the spot S annular in cross-section is strongest at its outer circumferential portion and is progressively weaker as it goes toward the inner circumferential portion. Thus, if processing is performed by the pulse laser beam LBb, the outer circumferential portion of the annular spot S is most processed. It is desired that the relationship between the outer diameter (d1) and inner diameter (d2) of the annular spot S be $0.5 \geq (d1-d2)/d1$. In addition, the outer diameter (d1) of the annular spot S is set at a size larger than the thickness of the cutting blade described above and smaller than the width of the street 23 formed on the semiconductor wafer 2. Preferably, 100 $\mu m \geq d1 \geq 30 \ \mu m$.

Figure 4:
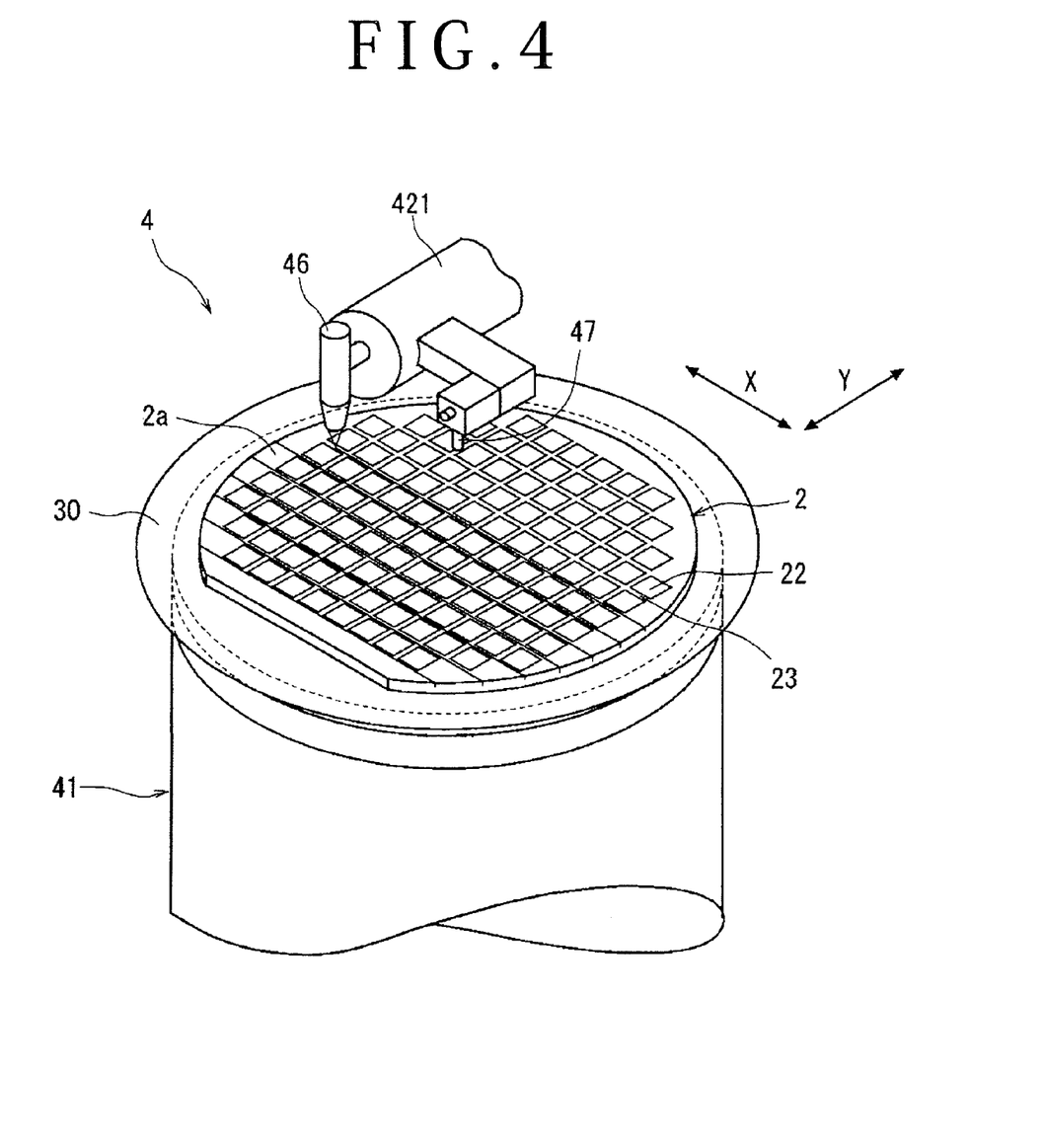
FIG. 4 is a perspective view illustrating an essential portion of a laser processing device used to perform a laser processing groove forming step in the wafer dividing method according to the present invention.

The laser processing machine 4 is provided with imaging means 47 attached to the leading end of the casing 421 constituting part of the laser beam irradiation means 42 as shown in FIG. 4. The imaging means 47 picks up an image of the workpiece held on the chuck table 41. The imaging means 47 includes an optical system and an image pickup device (CCD) and sends an image signal resulting from the image-pickup to control means not shown.

A description is given of the laser processing groove forming step performed using the laser processing machine 4 described above with reference to FIGS. 4, 7A, 7B and 8. In the laser processing groove forming step, the semiconductor wafer 2 is first placed on and sucked and held on the chuck table 41 of the laser processing means 4 shown in FIG. 4. In this case, the semiconductor wafer 2 is placed on the chuck table 41 with the side of the dicing tape 30 facing the downside. Thus, the semiconductor wafer 2 is held with the front surface 2a facing the upside. Incidentally, in FIG. 4, although the laser processing device is illustrated with the annular frame 3 attached with the dicing tape 30 omitted, the annular frame 3 is secured by a clamp, not shown, disposed on the chuck table 41.

The chuck table 41 that sucked and held the semiconductor wafer 2 as described above is moved immediately below imaging means 47 by process-transfer means not shown. After the chuck table 41 is positioned immediately below the imaging means 47, alignment work is executed to detect a processing area of the semiconductor wafer 2 to be processed by the imaging means 47 and by control means not shown. More specifically, the imaging means 47 and the control means not shown perform image processing such as pattern matching and the like for positioning between a street 23 formed to extend in the predetermined direction of the semiconductor wafer 2 and the concentrator 46 of the laser beam irradiation means 42 for applying a laser beam along the associated one of the streets 23. Thus, the alignment for a laser beam irradiation position is executed. Similarly, alignment for a laser beam irradiation position is executed on each of the streets 23 formed on the semiconductor wafer 2 to extend perpendicular to the predetermined direction mentioned above.

Figure 7A:
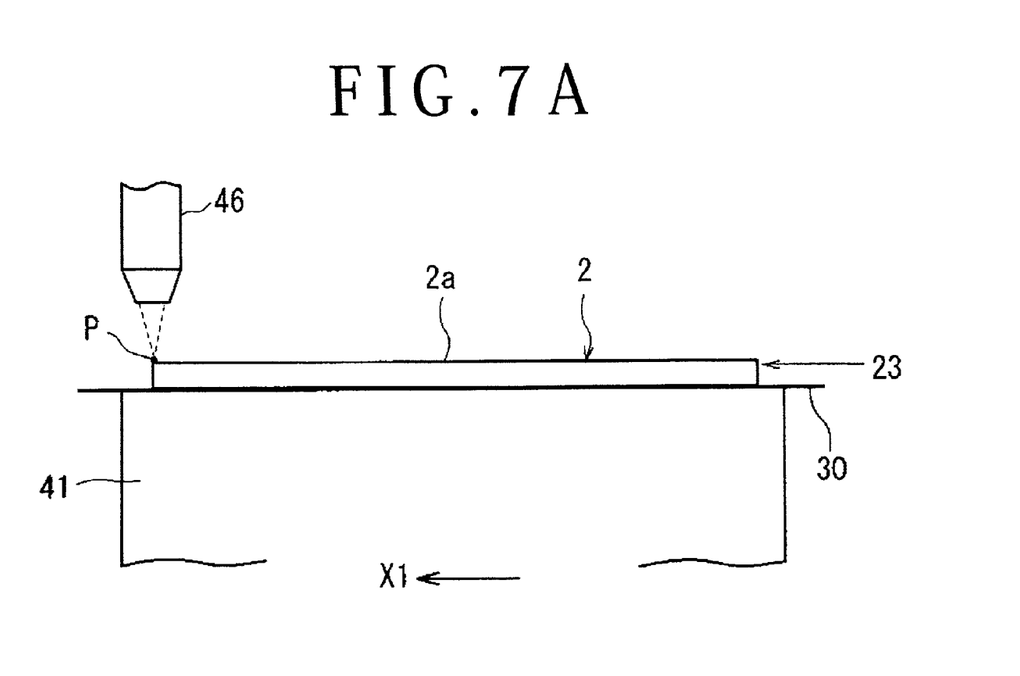
FIGS. 7A and 7B are explanatory views illustrating a laser processing groove forming step in the wafer dividing method according to the present invention.
Figure 7B:
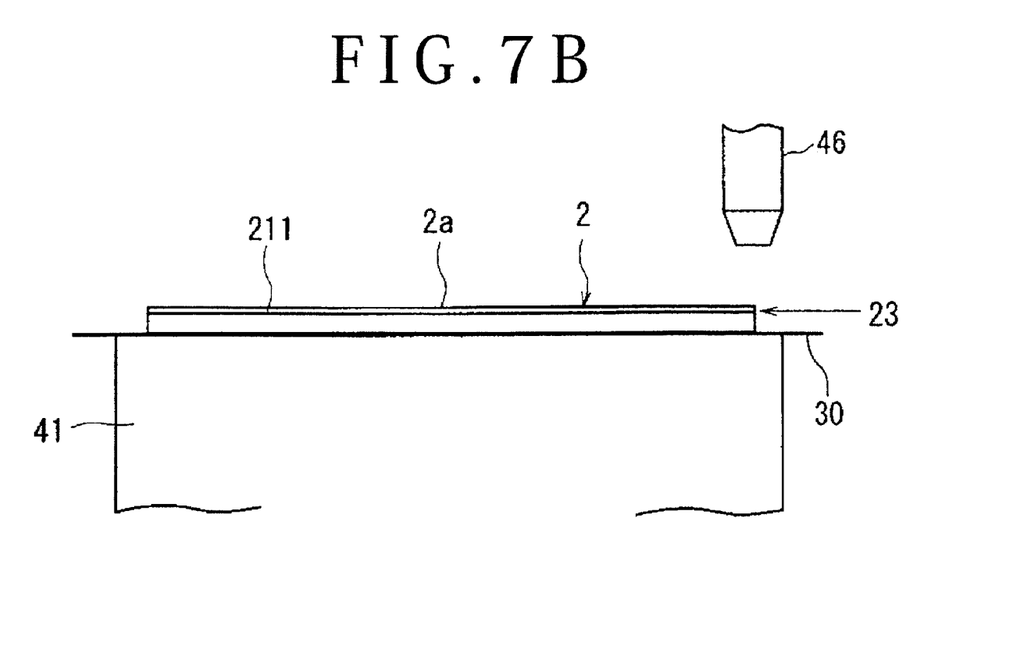

As described above, the street 23 formed on the semiconductor wafer 2 held on the chuck table 41 is detected and the alignment of the laser beam irradiation position is performed. Thereafter, as shown in FIGS. 7A and 7B, the chuck table 41 is moved to the laser beam irradiation area in which the condensing lens 424 of the laser beam irradiation means 42 for emitting the laser beam is located so that a predetermined street 23 is positioned immediately below the condenser 46. At this time, as shown in FIG. 7A, the semiconductor wafer 2 is positioned so that one end (the left end in FIG. 7A) of the streets 23 may be located at a position immediately below the condenser 46. Next, the chuck table 41 is moved in the direction indicated with arrow X1 in FIG. 7A at a predetermined process-transfer rate while a pulse laser beam capable of being absorbed by the laminated body 21 is being applied to it from the condenser 46 of the laser beam irradiation means 42. When the other end (the right end in FIG. 7B) of the street 23 reaches the position immediately below the condenser 46, the irradiation of the pulse laser beam is stopped and also the movement of the chuck table 41 is stopped. In the laser processing groove forming step, the focal point P of the pulse laser beam is made to coincide with a position near the front surface of the street 23.

Figure 8:
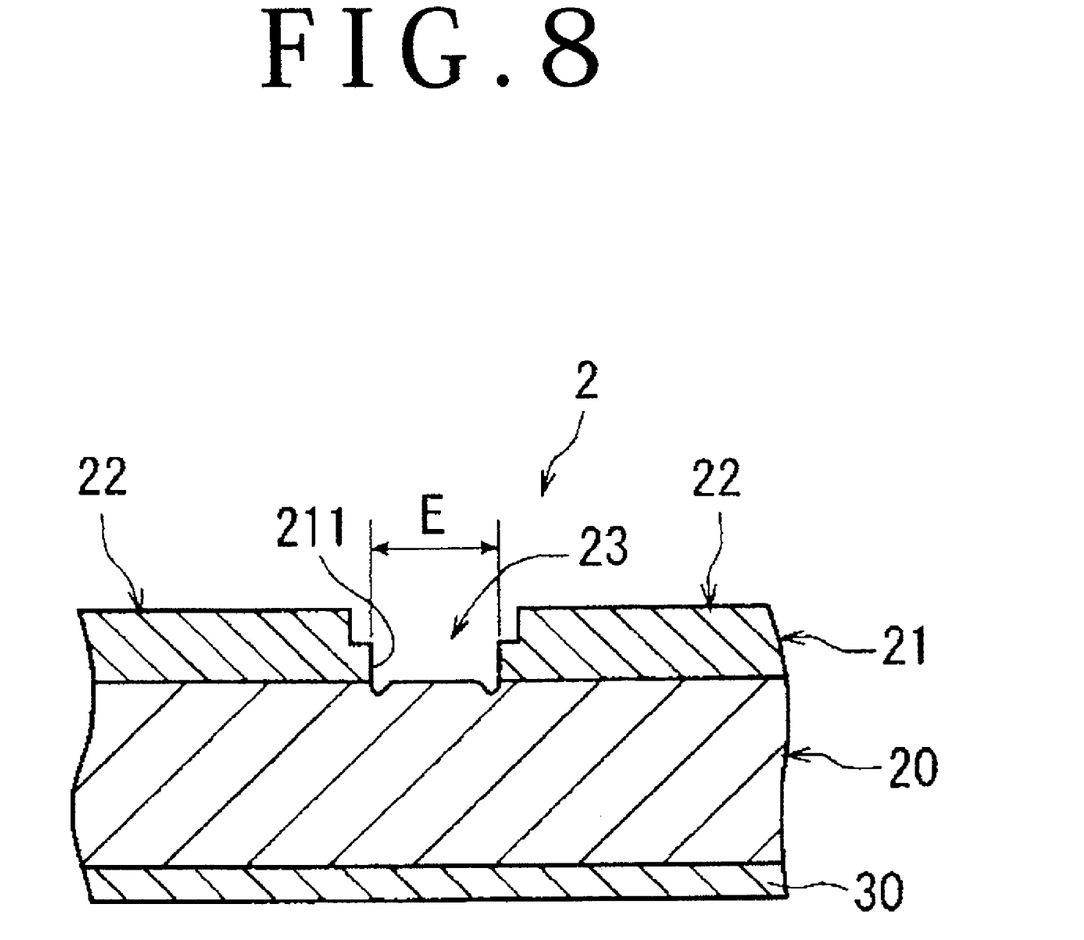
FIG. 8 an enlarged cross-sectional view of an essential portion of the semiconductor wafer, illustrating a laser processing groove formed in a street of the semiconductor wafer by the laser processing groove forming step shown in FIGS. 7A and 7B.

Consequently, as shown in FIG. 8, the laminated body 21 of the semiconductor wafer 10 is formed with a laser processing groove 211 reaching the semiconductor substrate 20 by the pulse laser beam LBb formed to have the spot S annular in cross-section as described above. The pulse laser beam LBb having the spot S annular in cross-section used to form the laser processing groove 211 has the energy distribution in which the outer circumferential portion is strongest as shown in FIG. 6. Thus, the laser processing groove 211 is formed to have the lateral walls vertical to the process surface (the upper surface) of the laminated body 21. The outer diameter (d1) of the annular spot S of the pulse laser beam LBb is set at a size greater than the thickness of the cutting blade described later and smaller than the width of the street 23 formed on the semiconductor wafer 10 as described above. Therefore, the width (E) between both the lateral walls of the laser processing groove 21 formed at the street 23 as described above is greater than the thickness of the cutting blade described later. Incidentally, the laser processing groove 211 formed along the street 23 is formed to have the lateral walls vertical to the process surface (the upper surface) of the laminated body 21. An unprocessed portion is not caused at the lateral wall lower portion. It is not necessary to increase the width (E) between the lateral walls of the laser processing groove 211 otherwise taking into account the unprocessed portion. Thus, the width of the street 23 formed in the semiconductor wafer 10 can be reduced as much as possible. In this way, the laser beam irradiation step described above is performed on each of the streets 23 formed on the semiconductor wafer 2.

The processing conditions of the laser processing groove forming step are set, for example, as follows:

| | |
|---|---|
| Light source for a laser beam | YVO4 laser or YAG laser |
| Wavelength | 355 nm |
| Output power | 4 to 10 W |
| Cyclic frequency | 10 to 100 kHz |
| Spot diameter (outer diameter) | 30 to 100 μm |
| Process-transfer rate | 50 to 200 mm/sec |

Incidentally, it is desired that energy density per pulse for the annular spot of the pulse laser beam LBb in the laser processing groove forming step be 5.7 J/cm$^2$ or more. If both the lateral walls of the laser processing groove 211 are each formed planar in the laser beam irradiation step described above, it is only needed to reduce the process-transfer rate but a problem of productivity arises. If it is assumed that the cyclic frequency of the pulse laser beam is H (Hz), the process-transfer rate is X (μm/sec) and the outer diameter of the annular spot S is d1 (μm), it is desired that the process-transfer rate and the cyclic frequency of the pulse laser beam be set to satisfy $X/H \leq 0.1\, d1$.

The laser processing groove forming step described above is performed on each of the streets 23 formed on the semiconductor wafer 2 as described above. Thereafter, a cutting step is performed in which the semiconductor substrate 20 of the semiconductor wafer 2 is cut by the cutting blade along each of the laser processing grooves formed at the respective streets 23. This cutting step is performed using a cutting device illustrated in FIG. 9. The cutting device 5 shown in FIG. 9 includes a chuck table 51 adapted to hold the workpiece; cutting means 52 provided with a cutting blade 521 adapted to cut the workpiece held on the chuck table 51; and imaging means 53 for picking up an image of the workpiece held on the chuck table 51. The chuck table 51 is configured to suck and hold the workpiece and to be moved by a moving mechanism not shown in the process-transfer direction indicated with arrow X in FIG. 9 and in the indexing-transfer direction indicated with arrow Y. The cutting blade 521 is attached to a disklike base and to the lateral outer circumferential portion of the base. In addition, the cutting blade 521 is formed to have a thickness of e.g. 20 to 40 μm. The imaging means 53 is composed of a usual image pickup device (CCD) or the like which picks up an image by a visible beam in the illustrated embodiment and sends a picked-up image signal to control means not shown.

Figure 9:
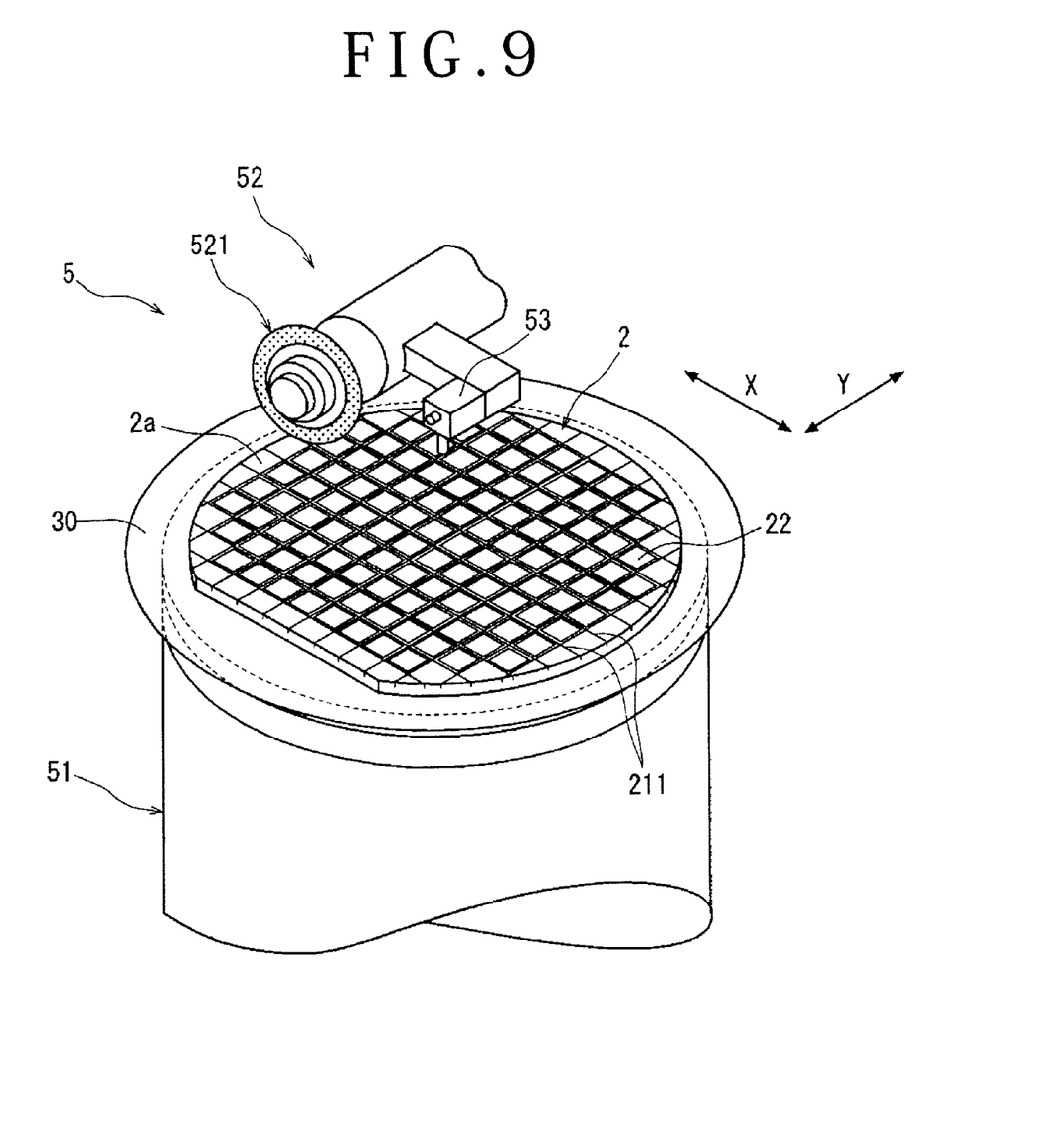
FIG. 9 is a perspective view illustrating an essential portion of a cutting device used to perform a cutting step in the wafer dividing method according to the present invention.

When the cutting step described above is performed using the cutting device 5 configured as above, the semiconductor wafer 2 is placed on and sucked and held on the chuck table 51. In this case, the semiconductor wafer 2 is placed on the chuck table 51 with the side of the dicing tape 30 facing the downside. Thus, the semiconductor wafer 2 is held with the front surface 2a facing the upside. Incidentally, although the cutting device is illustrated with the annular frame 3 attached with the dicing tape 30 omitted, the annular frame 3 is secured by a clamp, not shown, disposed on the chuck table 51.

The chuck table 51 that sucked and held the semiconductor wafer 2 as described above is moved to a position immediately below the imaging means 53 by process-transfer means not shown. After the chuck table 51 is positioned immediately below the imaging means 53, alignment work is executed to detect a cutting area of the semiconductor wafer 2 to be cut by the imaging means 53 and by the control means not shown. More specifically, the imaging means 53 and the control means not shown perform image processing such as pattern matching and the like for positioning between the cutting blade 521 and a laser processing groove 211 formed along a corresponding street 23 of the semiconductor wafer 2 by the laser beam irradiation step. Thus, the alignment for the cutting area is executed. Similarly, alignment for the cutting area is executed on each of the streets 23 formed on the semiconductor wafer 2 to extend perpendicularly to the predetermined direction mentioned above.

Figure 10A:
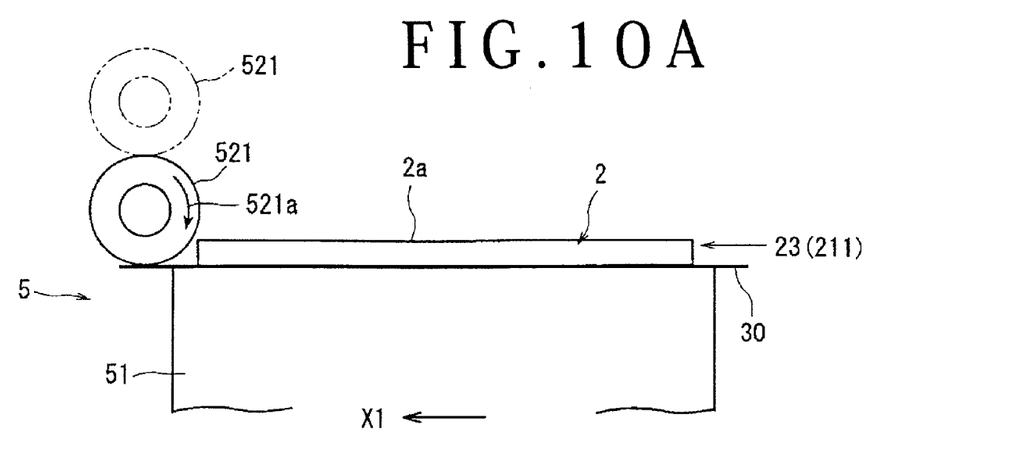
FIGS. 10A and 10B are explanatory views illustrating the cutting step in the wafer dividing method according to the present invention.
Figure 10B:
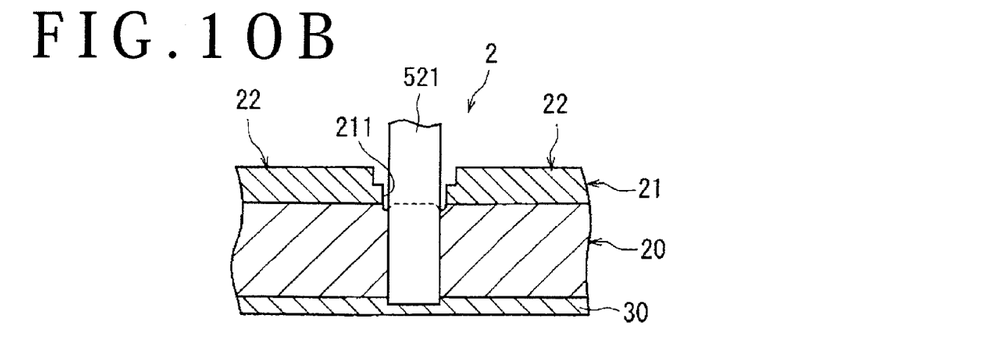
Figure 11:
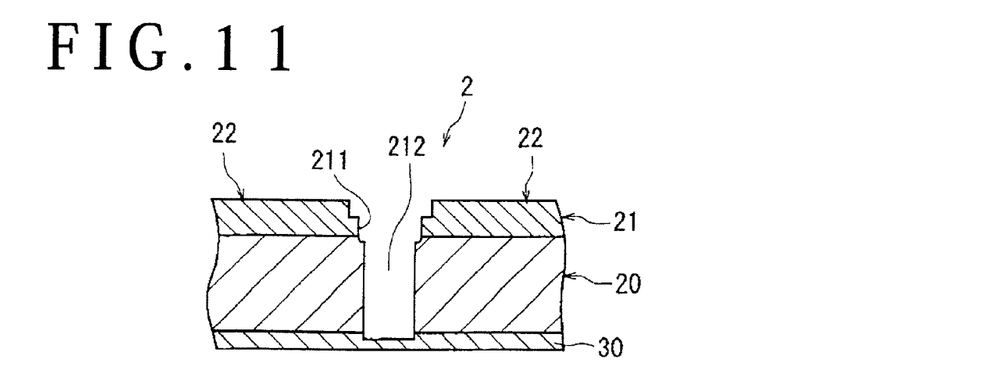
FIG. 11 is an enlarged cross-sectional view illustrating an essential portion of the semiconductor wafer in which a semiconductor substrate is cut by the cutting step shown in FIGS. 10A and 10B.

As described above, the laser processing groove 211 formed along the street 23 of the semiconductor wafer 2 held on the chuck table 51 is detected and alignment for the cutting area is performed. Then, the chuck table 51 holding the semiconductor wafer 2 is moved to a cutting-start position of the cutting area. In this case, as shown in FIG. 10A, the semiconductor wafer 2 is positioned so that one end (the left end in FIG. 10A) of the street 23 (formed with the laser processing groove 211) to be cut is located at a position rightward, by a predetermined amount, of a position immediately below the cutting blade 521. The cutting blade 521 is rotated at a predetermined rotary speed in the direction indicated with arrow 521a in FIG. 10A. In addition, the cutting blade 521 is incision-transferred downward by an incision-transfer mechanism not shown by a predetermined amount as indicated with solid lines in FIG. 10A from a standby position indicated with a two-dot chain line. This incision-transfer position is set at a position where the outer circumferential edge of eh cutting blade 521 reaches the dicing tape 30 as shown in FIGS. 10A and 10B.

After the incision-transfer of the cutting blade 521 is executed as described above, the chuck table 51 is moved at a predetermined cutting-transfer rate in the direction indicated with arrow X1 in FIG. 10A while rotating the cutting blade 521 at a predetermined rotary speed in the direction indicated with arrow 521a in FIG. 10A. When the right end of the semiconductor wafer 2 held by the chuck table 41 passes immediately below the cutting blade 521, the movement of the chuck table 51 is stopped.

Incidentally, the cutting step described above is performed under the processing conditions, for example, as follows:
Cutting blade: outer diameter 52 mm, thickness 40 μm
Rotary speed of the cutting blade: 30,000 rpm
Cutting-transfer rate: 50 mm/sec The cutting step described above is performed on the laser processing groove 211 at each of the streets 23 formed on the semiconductor wafer 2. As a result, the semiconductor substrate 20 of the semiconductor wafer 2 is cut along the cutting grooves 212 formed along the respective laser processing grooves 211 formed at the respective streets 23, whereby the semiconductor wafer 2 is divided into individual devices 22.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method of dividing a wafer into individual devices, the wafer being sectioned by streets to form the devices each made of a laminated body in which an insulating film and a function film are laminated on a front surface of a semiconductor substrate, the method comprising:

a laser processing groove forming step for forming a laser processing groove on the laminated body so as to reach the semiconductor substrate by applying a laser beam formed with an annular spot to the laminated body side of the wafer along the street, the annular spot having an outer diameter larger than a width of a cutting blade and smaller than a width of the street; and a cutting step for allowing the cutting blade to cut the semiconductor substrate of the semiconductor wafer along the laser processing groove formed at the street.

\* \* \* \* \*